United States Patent [19]

Fitzgerald, Jr. et al.

[11] Patent Number: 5,308,444
[45] Date of Patent: May 3, 1994

[54] METHOD OF MAKING SEMICONDUCTOR HETEROSTRUCTURES OF GALLIUM ARSENIDE ON GERMANIUM

[75] Inventors: Eugene A. Fitzgerald, Jr., Bridgewater; Jenn-Ming Kuo, Edison; Paul J. Silverman, Short Hills; Ya-Hong Xie, Flemington, all of N.J.

[73] Assignee: AT&T Bell Laboratories, Murray Hill, N.J.

[21] Appl. No.: 70,840

[22] Filed: May 28, 1993

[51] Int. Cl.$^5$ .............................................. H01L 21/20
[52] U.S. Cl. ............................ 117/90; 148/DIG. 169; 117/95; 117/105; 117/106; 117/954
[58] Field of Search ................ 156/610; 437/126, 132, 437/133, 105, 107; 148/DIG. 169

[56] References Cited

U.S. PATENT DOCUMENTS 4,786,616  11/1988  Awal et al. ......................... 437/105

FOREIGN PATENT DOCUMENTS 2-094431  4/1990  Japan ................................. 156/610

OTHER PUBLICATIONS

Lee in "MBE growth of low dislocation and high mobility GaAs on Si" Mat. Res. Soc. Symp vol. 67, (1986), pp. 29–36.

Georgakilas et al in "Achievements and x limitations in optimised GaAs films grown on Si by MBE" J. Appl. Phys 71(6), Mar. 15, 1992, pp. 2679–2701.

S. F. Fang, et al. "Gallium arsenide and other compound semiconductors on silicon" *J. Appl. Phys.* vol. 68, (1990) pp. R31–R58.

B. Y. Tsaur, et al. "Solid–phse heteroepitaxy of Ge on <100>Si" *Appl. Phys. Lett.* vol. 38, (1981) pp. 176–179.

M. Maenpaa, et al. "The heteroepitaxy of Ge on Si: A comparison of chemical vapor and vacuum deposited layers" *J. Appl. Phys.* vol. 53, (1982) pp. 1076–1083.

P. Sheldon, et al. "Growth and characterization of GaAs/Ge epilayers grown on Si substrates by molecular beam epitaxy" *J. Appl. Phys.* vol. 58, (1985) pp. 4186–4193.

Y. Kohama, et al. "Electron–Beam–Induced Current Observation of Misfit Dislocations at $Si_{1-x}Ge_x$/Si Interfaces" *Japanese Journal of Applied Physics* vol. 26, No. 12, (1987) pp. L1944–L1946.

E. A. Fitzgerald, et al. "Relaxed $Ge_xSi_{1-x}$ structures for III–V integration with Si and high mobilty two–dimensional electron gases in Si" *J. Vac. Sci. Technol.* vol. 10, (1992) pp. 1807–1819.

E. A. Fitzgerald, et al. "Strain–Free $Ge_xSi_{1-x}$ Layers With Low Threading Dislocation Densities Grown on Si Substrates" *Mat. Res. Soc. Symp. Proc.* vol. 220, (1991) pp. 211–215.

(List continued on next page.)

*Primary Examiner*—Olik Chaudhuri
*Assistant Examiner*—Ramamohan Rao Paladugu
*Attorney, Agent, or Firm*—Glen E. Books

[57] ABSTRACT

The invention is predicated upon the discovery by applicants that exposure of a Ge surface to arsenic produces a drastic change in the step structure of the Ge surface. Subsequent exposure to Ga and growth of GaAs produces three-dimensional growth and a high threading dislocation density at the GaAs/Ge interface. However exposure of the Ge surface to Ga does not substantially change the Ge step structure, and subsequent growth of GaAs is two-dimensional with little increase in threading dislocation density. Thus a high quality semiconductor heterostructure of gallium arsenide on germanium can be made by exposing a germanium surface in an environment substantially free of arsenic, depositing a layer of gallium on the surface and then growing a layer of gallium arsenide. The improved method can be employed to make a variety of optoelectronic devices such as light-emitting diodes.

6 Claims, 1 Drawing Sheet

OTHER PUBLICATIONS

C. G. Tuppen, et al. "Low Threading Dislocation Densities in Thick, Relaxed $Si_{1-x}Ge_x$ Buffer Layers" *Mat. Res. Soc. Symp. Proc.* vol. 220 (1991) pp. 187–192.

E. A. Fitzgerald, et al. "Totally relaxed $Ge_xSi_{1-x}$ layers with low threading dislocation densities grown on Si substrates" *Appl. Phys. Lett.* vol. 59 (1991) pp. 811–813.

Y. H. Xie, et al. "Molecular Beam Epitaxial Growth of Very High Mobility Two-Dimensional Electron Gases in SiGeSi Heterostructures" *Mat. Res. Soc. Symp. Proc.* vol. 220 (1991) pp. 413–417.

Y. J. Mii, et al. "Extremely high electron mobility in $Si/Ge_xSi_{1-x}$ structures grown by molecular beam epitaxy" *Appl. Phys. Lett.* vol. 59 (1991) pp. 1611–1613.

F. Schaffler, et al. "High-electron-mobility Si/SiGe heterostructures: influence of the relaxed SiGe buffer layer" *Semicond. Sci. Technol.* vol. 7 (1992) pp. 260–266.

F. K. LeGoues, et al. "Anomalous Strain Relaxation in SiGe Thin Films and Superlattices" *Physical Review Letters* vol. 66, No. 22 (1991) pp. 2903–2906.

P. R. Pulite, et al. "Suppression of Antiphase Domains In The Growth of GaAs On Ge(100) By Molecular Beam Epitaxy" *J. of Crystal Growth* vol. 81 (1987) pp. 214–220.

R. D. Bringans, et al. "Formation of the interface between GaAs and Si: Implications for GaAs-on-Si heteroepitaxy" *Appl. Phys. Lett.* vol. 51 (1987) pp. 523–525.

M. Zinke-Allmang, et al. "Clustering on surfaces" *Sur. Sci. Rep.* vol. 16 (1992) pp. 377–463.

METHOD OF MAKING SEMICONDUCTOR HETEROSTRUCTURES OF GALLIUM ARSENIDE ON GERMANIUM

FIELD OF THE INVENTION

This invention concerns a method for making a semiconductor heterostructure of gallium arsenide on germanium.

BACKGROUND OF THE INVENTION

There is considerable interest in heterostructure devices involving greater epitaxial layer thickness and greater lattice misfit than present technology will allow. For example, it has long been recognized that germanium-silicon alloy $Ge_xSi_{1-x}$ grown on silicon substrates would permit a variety of optoelectronic devices, such as LEDs, marrying the electronic processing technology of silicon VLSI circuits with the optical component technology of direct band semiconductors. Indeed, it has been proposed that an intermediate epitaxial layer of germanium-silicon alloy would permit the epitaxial deposition of gallium arsenide overlying a silicon substrate and thus permit a variety of new optoelectronic devices. However, despite the widely recognized potential advantages of such combined structures and despite substantial efforts to develop them, their practical utility has been limited by high defect densities in heterostructure layers.

A highly advantageous method for making a semiconductor heterostructure of germanium-silicon alloy on silicon is disclosed in U.S. patent application Ser. No. 07/690,429, filed in the names of Brasen et al entitled "Method For Making Low Defect Density Semiconductor Heterostructure and Devices Made Thereby" and assigned to applicants' assignee. The Brasen et al application discloses that one can grow on silicon large area heterostructures of graded $Ge_xSi_{1-x}$ alloy having a low level of threading dislocation defects by growing the alloy at high temperatures in excess of about 850° C. and increasing the germanium content at a gradient of less than about 25% per micrometer. Using this method one can grow low defect heterolayers of high germanium alloy.

The present invention is directed to the next step toward the long sought goal of direct band optoelectronics on silicon, namely a method for growing a low defect heterolayer of gallium arsenide on a layer of germanium.

Efforts to grow GaAs on group IV semiconductors predominantly begin with the growth of a prelayer of arsenic on the group IV substrate. The use of As prelayers has dominated GaAs/Si experiments because: a) As pre-layers are self-limiting, i.e. only one monolayer will deposit; and b) the As background pressure in most systems is high, so in the absence of special precaution, an As prelayer is unavoidable. Experiments have been conducted using Ga prelayers in GaAs growth on Si but the GaAs growth is equally poor (three-dimensional) using Ga or As prelayers. (See, for example, R. D. Bringans et al, *Appl. Phys. Lett.* 51, 523 (1987) and M. Zinke-Allmang et al, *Surf. Sci. Rep.* 16, 446 (1992).

Despite the closer lattice spacing, efforts to grow GaAs on Ge have also been less than satisfactory, with both As prelayers and Ga prelayers producing three dimensional, multiple domain growth. See, for example, S. Strite et al, *Appl. Phys. Lett.* 56, 244 (1990). Accordingly there is a need for an improved method of making semiconductor heterostructures of gallium arsenide on germanium.

SUMMARY OF THE INVENTION

The invention is predicated upon the discovery by applicants that exposure of a Ge surface to arsenic produces a drastic change in the step structure of the Ge surface. Subsequent exposure to Ga and growth of GaAs produces three-dimensional growth and a high threading dislocation density at the GaAs/Ge interface. However exposure of the Ge surface to Ga does not substantially change the Ge step structure, and subsequent growth of GaAs is two-dimensional with little increase in threading dislocation density. Thus a high quality semiconductor heterostructure of gallium arsenide on germanium can be made by exposing a germanium surface in an environment substantially free of arsenic, depositing a layer of gallium on the surface and then growing a layer of gallium arsenide. The improved method can be employed to make a variety of optoelectronic devices such as light-emitting diodes.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
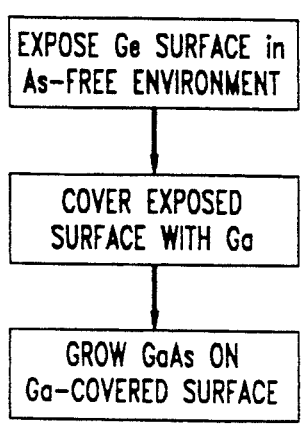
FIG. 1 is a flow diagram illustrating the method of making a semiconductor heterostructure of gallium arsenide on germanium in accordance with the invention.

Referring to the drawings, FIG. 1 is a flow diagram illustrating the process for making a semiconductor heterostructure of gallium arsenide on germanium in accordance with the invention. As shown, the first step is exposing a surface comprising germanium in an environment substantially free of arsenic. Specifically the Ge surface should be exposed only in an environment where the partial pressure of arsenic is less than about $10^{-8}$ Torr.

The Ge surface is preferably that of a (001) oriented germanium substrate, off-cut 1°-6° towards the [110] direction. Alternatively it can be the surface of a composite structure of germanium-silicon alloy/silicon of the type described in the aforementioned Brasen et al application. In a Ge-Si alloy, the surface should comprise 70-100% Ge.

In the preferred processes, epitaxial growth will be effected in a low pressure growth chamber such as a gas source molecular beam epitaxy system. As a preliminary step to exposing the Ge surface, any arsenic in the growth chamber is removed as by pumping down the growth chamber overnight to a $10^{-10}$ Torr base pressure. Also as preliminary steps the substrate is preferably cleaned using $NH_4OH:H_2O_2:H_2O$ and $HCl:H_2O_2:H_2O$ and rinsed in deionized water.

After cleaning, the substrate is introduced into the arsenic-free growth chamber and the Ge surface is exposed as by desorbing it of oxide. Typically, the surface is desorbed by heating the substrate between 350°–450° C. followed by slow heating to 600°–700° C. for about 20 minutes before cooling to growth temperature. With the protective oxide removed, the germanium surface is thus exposed in an arsenic-free environment.

The next step is covering the germanium surface by epitaxially growing a pre-layer of gallium. Preferably a monolayer or more of gallium is grown on the germanium to ensure coverage. A typical growth temperature is 350° C.

After the gallium pre-layer, the next step is to grow GaAs. This can be done by growing a sequence of $As_2$ and Ga monolayers or by applying $As_2$ and adding Ga. Preferably, GaAs growth is initiated at 0.1–0.3 micrometer/hr. After 1000–3000 Å, the growth temperature can be raised to 600° C. and the growth rate increased to 0.9 micrometer/hr.

The advantage of the method is that it produces single domain, two dimensional growth of gallium arsenide. RHEED images after 3000 Å of growth show two-dimensional growth with the [110] GaAs direction oriented along the off-cut direction of the substrate. TEM cross-sections of the GaAs film show misfit dislocations at the GaAs/Ge interface due to the small mismatch, yet the threading dislocation density has not increased due to the interface. The threading dislocations observed in the GaAs originate from the threading through the Ge layer. Thus one domain is formed, antiphase boundaries are eliminated, and threading dislocations glide freely in the GaAs, creating long misfit dislocations at the GaAs/Ge interface. The result is a high quality GaAs/Ge heterostructure which can be used to make optoelectronic devices.

Figure 2:
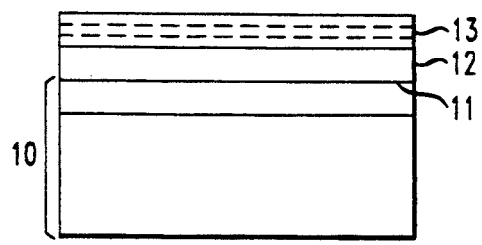
FIG. 2 is a schematic cross section of an illustrative LED device made in accordance with the method of FIG. 1.

As a specific example, FIG. 2 is a schematic cross section of an LED device made in accordance with the FIG. 1 process. The device comprises a composite substrate 10 having a germanium surface 11, a layer of gallium arsenide 12 grown on the germanium surface, and an InGaP homojunction LED structure 13 grown on the GaAs. More specifically, the composite substrate was a germanium-silicon alloy/silicon substrate grown as described in the aforementioned Brasen et al application on a [100] Si wafer off-cut towards the nearest <111> axis by 6°. The graded alloy region was terminated when pure Ge was achieved, and a 1 micrometer Ge cap was deposited to suppress the surface cross-hatch pattern.

The III-V epitaxial layers were grown in an Intervac Gen II gas-source MBE system. The In and Ga were provided by conventional effusion cells, and $As_2$ and $P_2$ molecular beams were produced by thermal decomposition of 100% $AsH_3$ and 100% $PH_3$ at 1100° C., in two independent low-pressure gas cracking ovens.

The GaAs layer grown on the Ge cap layer had a thickness of about 1 micrometer, and the InGaP LED structure 13 comprised a 5000 Å $p^+In_{0.5}Ga_{0.5}P$ layer followed by a 5000 Å intrinsic $In_{0.5}Ga_{0.5}P$ layer, a 5000 Å $n^+$-$In_{0.5}Ga_{0.5}P$ layer, terminated with a 500 Å $n^+$-GaAs contact layer. The LED was oriented with the $p^+$ layer closest to the Ge.

Figure 3:
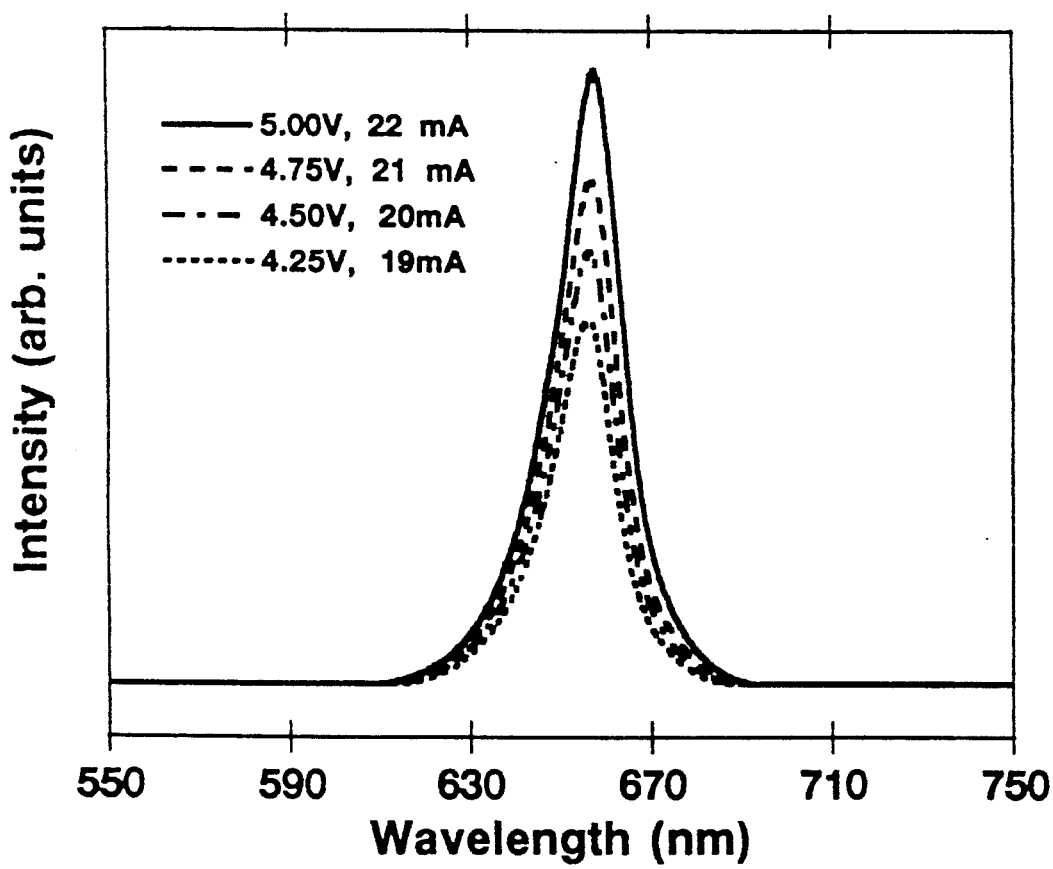
FIG. 3 is a graphical illustration of the power spectrum of the FIG. 2 LED.

FIG. 3 shows the power spectrum of the LED in surface-emitting geometry with half of a circular diode area covered by a metallic contact. Despite the inefficient geometry, the most intense spectrum was emitting in excess of 10 mW/cm$^2$ with a current density of 100 A/cm$^2$. The LED emissions were easily seen in a lighted room.

It is to be understood that the above-described embodiments are illustrative of only a few of the many possible specific embodiments which can represent applications of the principles of the invention. For example, while the invention has been described in relation to MBE growth, other types of epitaxial growth such as chemical vapor deposition (CVD) including MOCVD can be used. Thus numerous and varied other arrangements can be made by those skilled in the art without departing from the spirit and scope of the invention.

We claim:

1. An improved method of making semiconductor heterostructure of gallium arsenide on germanium comprising the steps of:
   exposing a surface comprising germanium in an environment having a partial pressure of arsenic less than $10^{-8}$ torr;
   epitaxially growing a layer of gallium on the exposed surface; and
   epitaxially growing a layer of gallium arsenide on the gallium covered surface.

2. The method of claim 1 wherein a monolayer or more of gallium is grown on said germanium surface.

3. The method of claim 1 wherein said epitaxial growth is effected by molecular beam epitaxy.

4. The method of claim 1 wherein said epitaxial growth is effected by chemical vapor deposition.

5. The method of claim 1 wherein said germanium surface is a (001) oriented germanium substrate off-cut 1°–6° towards the [110] direction.

6. The method of claim 1 wherein said germanium surface is germanium-silicon alloy comprising 70–100% germanium.

* * * * *